(12) United States Patent
Korrek

(10) Patent No.: US 8,321,613 B2
(45) Date of Patent: Nov. 27, 2012

(54) METHOD AND SYSTEM FOR SECURE TRANSMISSION OF PROCESS DATA TO BE TRANSMITTED CYCLICALLY VIA A TRANSMISSION CHANNEL BETWEEN A MASTER AND A SLAVE

(75) Inventor: Andre Korrek, Marienmuenster (DE)

(73) Assignee: Phoenix Contact GmbH & Co. KG (DE)

( * ) Notice: Subject to any disclaimer, the term of this patent is extended or adjusted under 35 U.S.C. 154(b) by 484 days.

(21) Appl. No.: 12/593,678

(22) PCT Filed: Mar. 22, 2008

(86) PCT No.: PCT/EP2008/002303
§ 371 (c)(1),
(2), (4) Date: Nov. 9, 2009

(87) PCT Pub. No.: WO2008/122355
PCT Pub. Date: Oct. 16, 2008

(65) Prior Publication Data
US 2010/0131686 A1 May 27, 2010

(30) Foreign Application Priority Data
Apr. 5, 2007 (DE) .......................... 10 2007 016 917

(51) Int. Cl.
*G06F 13/00* (2006.01)
(52) U.S. Cl. ..................... 710/110; 710/105; 710/104
(58) Field of Classification Search .......... 710/104–105, 710/110–119, 58–61, 29–37
See application file for complete search history.

(56) References Cited

U.S. PATENT DOCUMENTS 4,866,606 A * 9/1989 Kopetz .......................... 713/375
5,327,428 A * 7/1994 Van As et al. .................. 370/353
(Continued)

FOREIGN PATENT DOCUMENTS
CN 1574848 A 2/2005
(Continued)

OTHER PUBLICATIONS

Yolaine Cussac, "Application No. PCT/EP2008/002303 International Preliminary Report on Patentability and Written Opinion", Nov. 19, 2009, Publisher: PCT, Published in: EP.
"German Office Action for German International Application No. 10 2007 016 917.7-31", Dated Feb. 12, 2008, Publisher: German Patent Office, Published in: DE.

(Continued)

*Primary Examiner* — Raymond Phan
(74) *Attorney, Agent, or Firm* — Kaplan Breyer Schwarz & Ottesen, LLP

(57) ABSTRACT

The invention relates to a method and system for secure transmission of process data to be transmitted cyclically in a cyclical data transmission to be performed protocol-specifically via a transmission channel between a user functioning as a master and at least one user functioning as a slave that are connected to the transmission channel. Within a transmission protocol frame, a time slot that can always accommodate the same number of bits independently of the data to be transmitted is assigned to each slave during a data transmission cycle. For safety-relevant process data that is to be transmitted during a data transmission cycle from a slave to at least one additional user, or that is to be transmitted during a data transmission cycle from a user to at least one slave, additional first protection data for recognizing error-free transmission of this safety-relevant process data is generated and transmitted in each case.

19 Claims, 4 Drawing Sheets

U.S. PATENT DOCUMENTS

| | | | |
|---|---|---|---|
| 6,813,664 B2 * | 11/2004 | Koellner et al. | 710/117 |
| 6,957,115 B1 | 10/2005 | Meyer-Grafe et al. | |
| 7,158,532 B2 * | 1/2007 | Garney et al. | 370/447 |
| 7,480,282 B2 * | 1/2009 | Clune et al. | 370/350 |
| 7,836,224 B2 * | 11/2010 | Oster et al. | 710/33 |
| 2002/0018002 A1 * | 2/2002 | Stippler | 340/825.69 |
| 2003/0154427 A1 * | 8/2003 | Hermann et al. | 714/31 |
| 2004/0243728 A1 | 12/2004 | Meyer-Grafe et al. | |
| 2005/0164699 A1 * | 7/2005 | Temple et al. | 455/424 |
| 2006/0156127 A1 * | 7/2006 | Harter et al. | 714/732 |
| 2007/0148499 A1 | 6/2007 | Sonobe et al. | |
| 2010/0146225 A1 * | 6/2010 | Biehler et al. | 711/154 |

FOREIGN PATENT DOCUMENTS

| | | |
|---|---|---|
| DE | 102 12 151 A1 | 1/2004 |
| DE | 10 2004 044 764 A1 | 3/2006 |
| DE | 10 2006 011 524 B4 | 11/2007 |
| EP | 1788558 A1 | 5/2007 |
| JP | 05252168 A | 9/1993 |
| JP | 2007066111 A | 3/2007 |
| WO | 2006020278 A2 | 2/2006 |

OTHER PUBLICATIONS

Bannatyne R.: "Time-Triggered Protocol: Fault-Tolerant serial communications for real-time embedded systems", 1999 Digital Communications Design Conference, Motorola Transportation Systems Group, Jan. 1999, sites 75-83, XP001051065, Austin, Texas, USA.

Lisner J. Chr.: "Scheduling in a Time-Triggered Protocol with Dynamic Arbitration", University of Duisburg-Essen, Essen, Germany, Isdustrial Electronics, 2005, proceedings of the IEEE international symposium on Dubrovnik, Croatia Jun. 20-23, 2005, Piscataway, NJ, USA, XP010850298.

Thomas Dohmke: "Bussysteme im Automobil CAN, FlexRay und Most", internet citation XP002331425, internet: URL:http://thomas.domke.de/de/projekte/bus, Berlin, Mar. 2002.

PCT International Search Report and Written Opinion, International Application PCT/EP20081002303, Jun. 30, 2008, Examiner: Michael Nold.

Wang, Guixia, "CN Application No. 200820010575.4 Office Action Dec. 28, 2011"Publisher: SIPO, Published in: CN.

H. Ohishi, "Japanese Patent Application No. 2010-501402 Office Action", Jun. 13, 2012, Publisher: Japanese Patent & Trademark Office, Published in: JP.

* cited by examiner

Figure 2

| Address | Function code | Data | CRC |
|---------|---------------|------|-----|
| 1 Byte | 1 Byte | 1 ..64 Byte | 2 Bytes |

| Error Exception | Error code |
|-----------------|------------|
| 1 Byte | 1 Byte |

METHOD AND SYSTEM FOR SECURE TRANSMISSION OF PROCESS DATA TO BE TRANSMITTED CYCLICALLY VIA A TRANSMISSION CHANNEL BETWEEN A MASTER AND A SLAVE

FIELD OF THE INVENTION

The invention relates to a method and a system for secure transmission of process data to be transmitted cyclically.

BACKGROUND OF THE INVENTION

As is well known, a field bus is an industrial communications system used in data transmission systems that links a number of connected field devices, such as measuring probes (sensors), final control devices and/or drives (actuators), to a controller unit, wherein the units that provide the actual connection to the bus will be referred to below as bus components.

In a number of applications, the determinism, i.e., the predefined nature and unchangeability in the transmission of process data is more important than the actual transmission speed itself. For instance, field busses with connected users are known, in which a cyclical transmission of process data via a common transmission channel is preformed in order to transmit process data between individual users, thus sending and receiving process data such as, in particular, process input data, process output data and control data. For this purpose, protocol-specific data is read out from field devices connected to slave users during predetermined data cycles by a user acting as a master, and is written in the respective subsequent data cycles into field devices connected to slave users.

In addition, the data to be transferred in many system applications is in part safety-relevant data, so that errors in the data transmission must be recognized as early as possible and there must be a quick reaction when a error is recognized; e.g., a user or a (sub)system must be run into a safe condition. In a transmission of safety-relevant data via a bus, there are essentially six classes of errors to be taken into consideration. These relate to the repetition, the loss, the insertion, the incorrect sequence, the destruction, and the delay of safety-relevant data. The transmission of this data must therefore be secure.

To guarantee secure transmission of data, particularly safety-relevant process data, at least in such a manner that the above-cited error classes can actually be recognized if present, it is basically common practice to expand the transmitted process data with extra control data such as time stamps, user information and/or check information, e.g., CRCs (cyclic redundancy checks). It is a crucial disadvantage in this regard that the overhead to be transmitted conventionally increases sharply relative to the payload data to be transmitted, and the protocol efficiency thereby decreases. This weakness becomes particularly striking if only a small amount of safety data per user is to be transmitted, or if this takes place only infrequently.

One problem is therefore to demonstrate a way to transmit process data via a common transmission channel that guarantees the secure transmission of data if needed, without significantly influencing the protocol efficiency, even for applications in which equidistance of sampling and determinism in the transmission of data are important criteria.

SUMMARY OF THE INVENTION

The invention provides a method and system for secure transmission of process data to be transmitted cyclically in which a protocol-specific cyclical data transmission via a common transmission channel is performed at least between a user functioning as a master and at least one user functioning as a slave. Within a transmission protocol frame, a data field or time slot that can always accommodate the same number of bits independently of the data to be transmitted is assigned to each slave during a data transmission cycle. For safety-relevant data that is to be transmitted securely during a data transmission cycle from a slave to at least one additional user, or that is to be transmitted securely during a data transmission cycle from a user to at least one slave, additional first protection data for recognizing error-free transmission of the safety-relevant data is generated and transmitted in each case, wherein the process data to be securely transmitted is embedded together with the respective first protection data into the data field or time slot assigned to the respective slave and transmitted with it.

The equidistance of the sampling as well as the determinism in the transmission of process data is thus preserved and the basic payload data throughput for process data is not diminished thereby. In addition, components that do not have or support such secure data transmission are not influenced thereby.

According to a particularly expedient refinement, it is further provided that the first protection data is generated using safety data that is transmitted by a predetermined user via the transmission channel during a cyclically preceding data transmission cycle.

Consequently, even for safety-relevant process data that does not change from one data transmission cycle to a subsequent data transmission cycle, an error recognition that brings about a dynamic that reveals essentially all safety-relevant faults that are possible during a transmission can be assured by the invention with the highest security in a particularly effective manner and with only a low overhead.

For this purpose a particularly expedient refinement provides for using a run date that changes cyclically with each data transmission cycle, whereby it is assured that two successive data transmission cycles can never contain the same data inside the transmission protocol frame.

The run date is preferably changed in the next cycle even after the faulty transmission of a transmission protocol frame, so that the user generating this run date can then also be monitored in the simplest manner for faults, even within the secure transmission.

An expedient refinement further provides that process data for components that can handle safety-relevant process data is additionally embedded in the data field or time slot of the safety user generating the safety data.

A preferred embodiment provides in this regard that controller data is embedded in this time slot as additional process data. For example, selected user units handling safety-relevant process data, including units downstream thereof, can thereby be enabled or blocked.

For further enhancement of safety it is preferably provided in addition that the safety data of the safety user is also secured by protection data.

For the generation of safety data, it is further advantageous to include at least one identifier that identifies a respective slave user handling safety-relevant process data so that, in particular, an incorrect sequence in the transmission of safety-relevant data is also recognizable.

Preferred embodiments further provide that each transmission protocol frame is secured as a whole by protection data generated by using all data contained therein.

Preferably the time slots assigned to components that can handle safety-relevant process data are arranged inside the transmission protocol frame in front of time slots assigned to users that cannot handle safety-relevant process data.

BRIEF DESCRIPTION OF THE DRAWINGS

Further advantages and characteristics of the invention follow from the description below of an exemplary embodiment of the invention with reference to the appended drawings, which show FIG. 1 a basic system structure that can be used for the invention, FIG. 2 a preferred frame structure for a telegram usable according to the invention, FIG. 3 a frame structure according to the invention during a data exchange access, FIG. 4 a "Safety Control PDC" according to the invention, and FIG. 5 a "Safety Data PDC" according to the invention.

DETAILED DESCRIPTION

Figure 1:
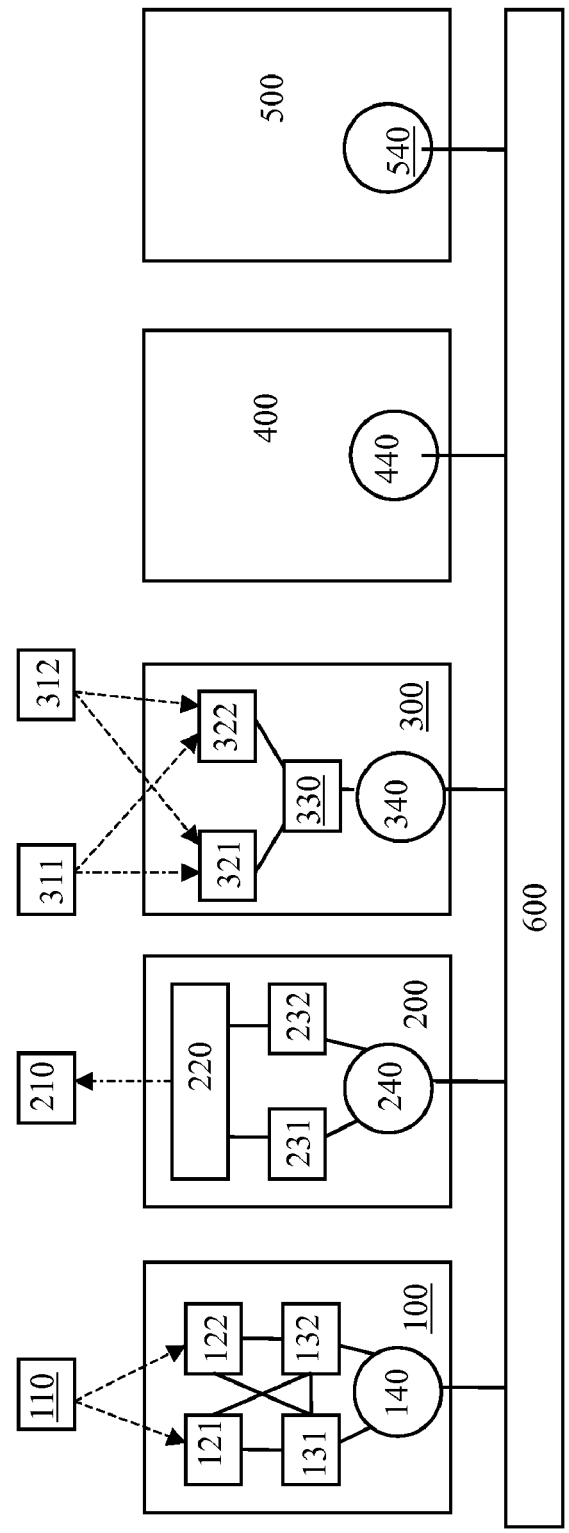

Below, reference will first be made to FIG. 1, which shows a basic system structure usable within the context of the invention. The illustrated system structure is designed topologically as a line, but a star topology or desired mixed forms are also conceivable.

Five bus users connected to a bus 600 can be seen. A first bus user is a safety-oriented master 100, also referred to below as a safety master, which is also a bus master in the present example, although this is not compulsory within the context of the invention. It can in general be a defined, appropriately predetermined safety user. A second and third bus user is, respectively, a safety-oriented slave output user 200, referred to below as a safety output slave, and a safety-oriented slave input user 300, referred to below as a safety input slave. A fourth and fifth bus user is, respectively, a non-safety-oriented slave output user 400, referred to below as an output slave, and a non-safety-oriented slave input user 500, referred to below as an input slave. Safety-oriented components, i.e., components that handle safety-relevant process data, and non-safety-oriented components can thus be mixed and arbitrarily arranged.

With respect to the safety-oriented users of the illustrated exemplary system structure, an emergency-off switch 110 is connected to safety master 100, wherein the safety input information of said switch is obtained redundantly by user 100 via two inputs 121 and 122 and processed protocol-specifically, initially via two redundant processing channels 131 and 132, before a signal coupling to bus 600 occurs. A motor 210, for example, is connected to safety output slave 200, user 200 initially performing a processing protocol-specifically via two redundant processing channels 231 and 232 after a signal outcoupling from bus 600, and transferring the safety-relevant output information to motor 210 via an output 220. A protective door 311 and a rotary speed encoder 312, the safety-relevant input information of which is obtained by user 300 redundantly via two inputs 321 and 322 and processed protocol-specifically via a processing channel 331 before a signal coupling to bus 600 occurs, are connected to safety input slave 300.

A safety-oriented function is thus realized as a rule using redundant processing, by means of two channels separated from one another in hardware, with the respective interface 140, 240, 340, 440 and 540 of a user with bus 600 generally being realized with only one channel. In addition to a reduction of the required space and the costs, twice as many components can be operated on the bus, particularly with respect to bus load, power consumption and capacity. Faults that are caused by the bus coupling, based on line drivers or galvanic separation, for example, can typically be recognized by the line protocol that is used. The processing unit of the safety-relevant components need not necessarily be constructed with two channels in hardware; rather, it is sufficient in many cases if the software is implemented with two channels.

Bus 600 now provides the common data line for the method and the transmission system according to the invention for transmitting and receiving all data, particularly process data. Based, for example, on a LIN bus known from automotive engineering, such a class-defining transmission system, in which protocol-specific data is read out during defined data cycles by a master from field devices connected via bus components, and can be written to the latter during respective subsequent data cycles, operates at roughly 19.2 to 38 kbd.

The invention makes use of the fact that for many applications, the determinism, i.e., the predefined nature and unchangeability in the transmission of process data, is more important than the actual transmission speed itself. This determinism is defined by the bus cycle time of the transmission system, which is expediently adjustable and lies in a range between 10 and 100 ms. Consequently, a default setting of, e.g., 25 ms is sufficient for a transmission of 16 process data values à 16 bits per cycle.

In an exemplary method according to the invention, process input and output data is therefore basically transmitted in a fixed interval, offset in each case by half the bus cycle time. A transmission protocol for the cyclical transmission of process input and output data thus frequently uses two different data exchange services, also referred to below as data exchange modes. In this case, a bus cycle consequently comprises a data cycle based on a PD read service and a subsequent data cycle that is based on a PD write service.

In the transmission of process output data, a master in principle sends the users associated therewith all the data for the connected field devices in the PD write service, and expediently then determines a CRC (cyclic redundancy check), which it also transmits. The transmission system is expediently constructed such that all connected users read all the information transmitted in this manner and preferably likewise form a CRC, which they compare with the master's CRC, so that an error message is generated in case of an error and, for example, selected users or individual field devices can be run into a secure state. In the transmission of process input data, the master first sends a broadcast address in a PD read service, followed by a function code. The additional connected users then place data of their connected field devices, i.e., particularly their process input data, bit by bit on the data line in respective time slots provided therefore. In a preferred embodiment, the users are again capable of recognizing all data by monitoring the data line, and of again forming a CRC for it.

A preferred, but basically protocol-dependent, frame structure for the method according to the invention during a data exchange service or cycle is illustrated in FIG. 2. The respective telegram length in this case comprises, e.g., 68 characters. The telegram transmitted during a data exchange service or cycle accordingly comprises an address of one byte that determines a given user, or all users in the case of a broadcast address, as receivers. Then a function code follows, likewise comprising one byte in the present example, which defines the intended purpose of the subsequent payload data. In the present example, the actual payload data comprises 64 bytes, followed by a CRC comprising 2 bytes. A maximum pause between individual characters of such a telegram must not be exceeded during the transmission, since otherwise an error would be recognized. This pause is specified at 1 ms, for example, and is also referred to as the inter-character timeout. In addition, a quiescent period (inter-frame timeout), e.g., 2 ms, between two successive telegrams can be provided, so that any error handling that may be necessary can be performed correctly. As shown in FIG. 2, a back-transmission of an error exception code and an error code by the receiver, i.e., the message that an error has been recognized, and which error was recognized, preferably takes place only upon recognition of such an error and expediently begins between one and two milliseconds after the transmitter's CRC has been received by the receiver.

As already indicated above, the invention is thus based on a cyclically constructed data exchange that takes place in a permanently defined pattern and, for example, is subdivided into the above-mentioned PD write and PD read access or cycle, so that data is sent from the master to the slaves with the PD write access, and in the other direction with the PD read access, i.e., essentially from the slaves to the master. For the subsequent description it may be assumed that that each process data item consists of 16 bits and is referred to as a process data channel (PDC). A defined process data channel (PDC) is permanently assigned to each user.

Figure 3:
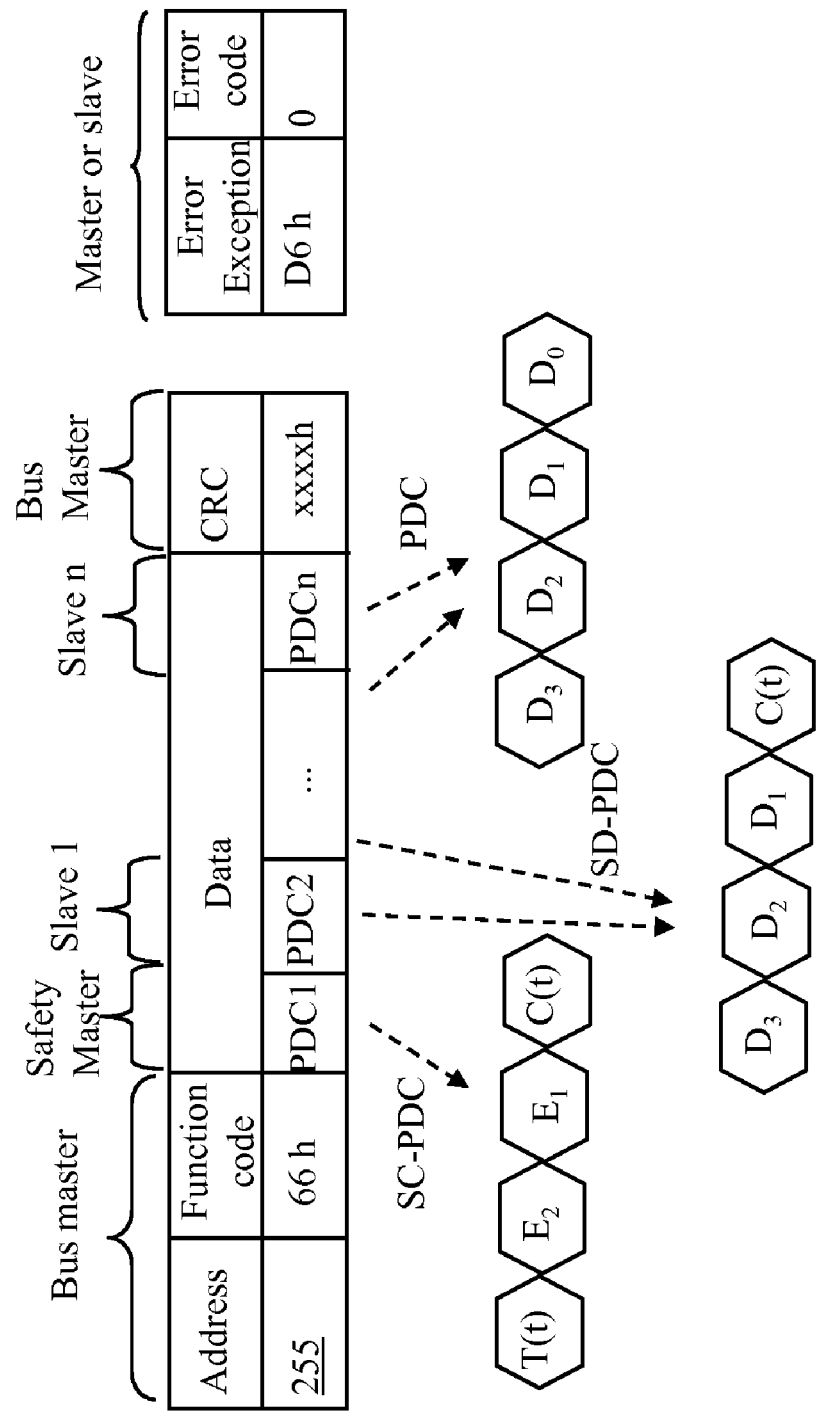

As can be seen in FIG. 3, each data exchange cycle is initiated by the bus master with the transmission of an address and a function code. Subsequently, the PDCs are generated and read in. If all PDCs have been read in, the master generates a checksum CRC. All users likewise calculate a checksum and compare it to that generated by the master. If at least one user recognizes a difference, then the error response illustrated in FIG. 3 is generated, for example, and all users reject the data of this last cycle according to the preferred embodiment, in which all users must read all data. It is additionally expedient for the generation of the checksum that those producing it do not do so with the data they read back from the bus, but rather with that which they transmit to the bus, since only in that way can a complete monitoring be assured.

The structure of a protocol frame as illustrated in FIG. 3 need therefore not differ from the disclosure of German Patent Application No. 10 2005 053 103.2 with the title "Method and System for Transmitting Cyclical and Acyclical Data" submitted by the same applicant on Nov. 4, 2005, so that the contents of the disclosure in this regard are incorporated in full into the contents of the present application.

The difference, particularly as a supplement or alternative to the above-referenced disclosure, lies in the payload data area, i.e., the PDCs.

The first PDC is assigned to the safety master and can accordingly be referred to as a safety-relevant control PDC or control PDC. A preferred basic structure of the safety control PDC is separated from the protocol frame in FIG. 3 and labeled "SC-PDC." According to the invention, this "SC-PDC" is generated by the safety master. Following the safety control PDC generated by the safety master, the PDCs of the "normal" slave users are transmitted. The second PDC illustrated in FIG. 3 is assigned to a safety input slave or safety output slave, and can accordingly be referred to as a safety-relevant data PDC or safety data PDC. A preferred basic structure of the safety control PDC is separated from the protocol frame in FIG. 3 and labeled "SC-PDC." The last PDC illustrated in FIG. 3 is assigned to an input slave or an output slave. A preferred basic structure of the safety relevant PDC is likewise separated from the protocol frame in FIG. 3 and only labeled "PDC." This PDC comprising non-safety-relevant data comprises according to the illustration a process data value of 16 bits subdivided into four nibbles $D_3$, $D_2$, $D_1$ und $D_0$.

Figure 4:
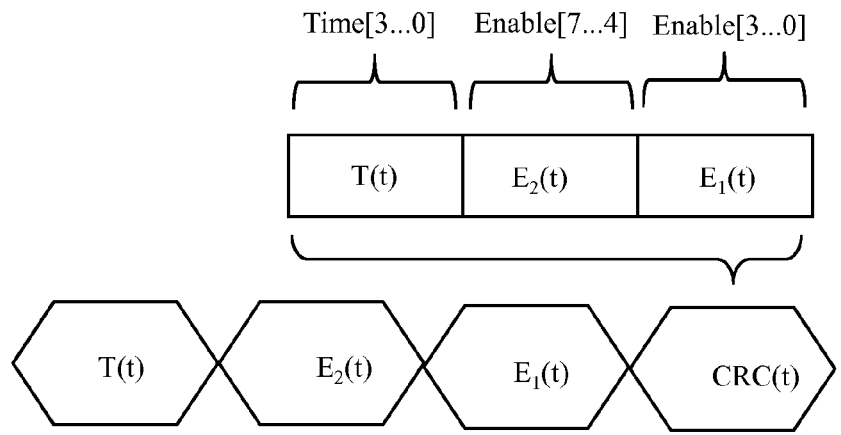

Reference will be made below to FIG. 4, which shows the structure of a safety control PDC, labeled SC-PDC in FIG. 3, in greater detail.

According to a particularly preferred embodiment, the safety control PDC provides a central element for the security of the data transmission, as well as for the implementation of the safety function according to the invention. The safety control PDC is organized in the same number of partial units with a respectively equal number of bits as is every other PDC, i.e., in four parts, each with four bits in the present example. The highest-order nibble provides a run date or run index T(t). This run index is generated in each case by the safety master from four bits, indicated with Time[3 . . . 0] in FIG. 4, and is modified with each bus cycle. Even if the transmission of a telegram frame has run without error, the run index is modified with the next cycle. It is thereby assured that two successive data transmissions never contain the same data word. The two subsequent lower-order nibbles contain, for example, enabling information. $E_2(t)$ and $E_1(t)$, with which the safety master can control safety circuits independently and individually. $E_2(t)$ and $E_1(t)$ each again comprise four bits, as shown in FIG. 4 for $E_2(t)$ with Enable[7 . . . 4] and for $E_1(t)$ with Enable[3 . . . 0], so that a total of eight mutually independent safety circuits can be controlled, each safety circuit being enabled or blocked if the associated bit is set or reset.

The above-described data of the safety control PDC is protected by a CRC comprising 4 bits that is formed regarding this data and is transmitted in the lowest-order nibble. The safety control PDC is accepted by safety slaves and thus recognized as valid if the transmitted CRC agrees with a CRC calculated by itself regarding the data T(t), $E_2(t)$ and $E_1(t)$, and if it has been modified in at least one bit since the last data exchange. Users that do not know or do not support this operating mode are not influenced by it.

Figure 5:
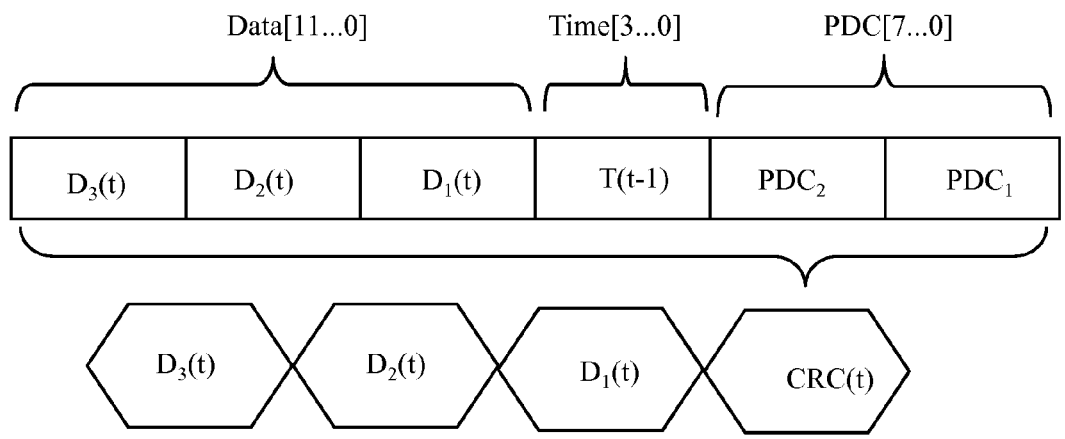

Reference will be made below to FIG. 5, which shows the structure of a safety data PDC, labeled SC-PDC in FIG. 4, in greater detail.

In contrast to data transferred with a standard PDC, labeled PDC in FIG. 3, which comprises 16 payload data bits in the present example, a safety data PDC according to the invention consists of only 12 payload data bits. The additional four bits, preferably the four lowest-order bits, are used for the transmission of CRC information, analogously to the safety control PDC. The CRC, however, is not generated only from the payload data bits $D3(t)$, $D2(t)$ and $D1(t)$, which are constructed from a total of 12 bits labeled Data[11 . . . 0] in FIG. 6. Additional information is also included for generating the CRC information, without the necessity, however, of transmitting the additional information as well; rather, it is already known to the users at the time the CRC information is generated. This additional information to be included in the calculation preferably comprises information from a prior transmission, such as the run index T(t−1) from the last valid transmission cycle, and respective specified PDC data from specified PDCs, such as the numbers of PDC2 and PDC1, as an additional protection identifier. It is true here as well that the data of the safety data PDCs is only valid if the transmitted CRC agrees with the CRC calculated by the consuming user, and the PDCs of a producing user are unequal at two successive transmission cycles, i.e., SD-PDC(x,t) and SD-PDC(x, t−1). Once again, users that do not recognize or do not support this operating mode are not influenced by it.

Therefore, an essential advantage of the invention as a whole is that a marked reduction of the overhead for data protection and error recognition is required, since the information necessary for data protection and error recognition need not be transmitted cyclically with the payload data to be protected, but is instead generated from system, master and/or safety master information. Together with the simple system construction, this consequently leads to each safety-relevant bus user being able to perform a check of the safety-relevant data and system integrity. The safety functions can thus be performed in a single channel on the user side, since the overall system assures the necessary fault tolerance.

In conclusion, the invention is based on the following basic characteristics. Data is transferred by means of a telegram from a data source to at least one connected data sink. In the data field of the telegram, the first position is the data of a safety master, which comprises run information, in particular time information, payload data and a suitable check (CRC). All connected slaves expediently read the data and determine an overall CRC on their own, which is calculated over all transmitted data and is appended in the transmission of the telegram by the bus master.

If at least one user recognizes an error, then it generates an error telegram. The contents of the error telegram are subordinate; what is decisive is merely that the timeout specified in the bus system is violated. If this is the case, then the telegram is classified as faulty and is rejected. Each slave is assigned a time slot that follows the time slot of the master. During a corresponding data exchange mode, the slaves can transmit a number of data bits on their own in the respective assigned time slot, and with a slight sacrifice of payload data bits, can optionally transmit them securely, whereby they protect them with a check (CRC) that is also transmitted in the respective assigned time slot. This check is formed regarding the remaining payload data bits, as well as additional information already known to the users. This additional information preferably comprises run information, specifically time information, from the preceding cycle and at least one process data number. By integrating the run information, it is assured in particular that static errors are recognized since something, i.e., at least one bit, must always change.

The invention claimed is:

1. A method for secure transmission of process data to be transmitted cyclically in a cyclical data transmission to be performed protocol-specifically via a transmission channel between at least one user functioning as a master and at least one user functioning as a slave that are connected to the transmission channel, the method comprising:
   assigning to each slave during a data transmission cycle, within a transmission protocol frame, a time slot that can always accommodate the same number of bits independently of the data to be transmitted; and
   generating and transmitting a first set of protection data, wherein the first set of protection data is for recognizing error-free transmission of safety-relevant process data that is to be transmitted securely during the data transmission cycle from a slave to at least one additional user, or that is to be transmitted securely during the data transmission cycle from a user to at least one slave, wherein the process data to be securely transmitted is embedded together with the respective first set of protection data into the time slot assigned to the respective slave and transmitted with it,
   wherein the time slots assigned to users that can handle the safety-relevant process data are arranged inside the transmission protocol frame ahead of time slots assigned to users that cannot handle the safety-relevant process data.

2. The method according to claim 1, further comprising:
permanently specifying one user as a safety user, and
generating the first set of protection data using safety data that was transmitted by the safety user via the transmission channel during a cyclically preceding data transmission cycle, wherein the first set of protection data is read during the data transmission cycle at least by users that can handle the safety-relevant process data.

3. The method according to claim 1, wherein the respective safety-relevant process data to be protected is included for generating the first set of protection data.

4. The method according to claim 1, wherein at least one protection identifier that identifies the respective slave to which the safety-relevant process data is to be assigned is used for generating the first set of protection data.

5. The method according to claim 1, wherein each transmission protocol frame is protected as a whole with a third set of protection data generated by the master using all the data transmitted therein, and all slaves can read the data contained in the transmission protocol frame.

6. The method according to claim 2, further comprising permanently assigning a time slot inside the transmission protocol frame to the safety user, wherein the safety data of the safety user that is employed for generating the first set of protection data is embedded in the time slot associated with the safety user and comprises a run date that changes cyclically with each data transmission cycle, wherein the time slot is also read during the data transmission cycle at least by the users that can handle the safety-relevant process data.

7. The method according to claim 4, wherein the time slot assigned to a respective user occupies a predetermined position inside the transmission protocol frame, and the protection identifier is formed at least using a predetermined position among multiple positions.

8. The method according to claim 6, characterized in that the run date is also changed in the next data transmission cycle following a faulty transmission of the transmission protocol frame.

9. The method according to claim 6, wherein process data of users that can handle the safety-relevant process data is also embedded as safety data in the time slot assigned to the safety user.

10. The method according to claim 6, further characterized in that the run date of the safety user that is transmitted during a data transmission cycle is employed by other users that can handle the safety-relevant process data to generate the first set of protection data for the next data transmission cycle, insofar as the safety-relevant process data is to be transmitted.

11. The method according to claim 9, wherein control data is embedded in the time slot as additional process data.

12. The method according to claim 9, characterized in that the safety data in the time slot of the safety user is employed for generating a second set of protection data, which is embedded in the time slot together with the safety data.

13. A transmission system comprising:
   at least one user functioning as a bus master; and
   at least one user functioning as a slave that are connected to a common bus for protocol-specific cyclical data transmission, wherein within a transmission protocol frame, a time slot that can always accommodate the same number of bits independently of the data to be transmitted is assigned to each slave during a data transmission cycle, and in a time slot, inside of which safety-relevant process data that is to be transmitted securely during the data transmission cycle from a slave to at least one additional user, or that is to be transmitted securely during the data transmission cycle from a user to at least one slave, a first set of protection data for recognizing error-free transmission of the safety-relevant process data is embedded, wherein the time slots assigned to the users that can handle the safety-relevant process data are arranged inside the transmission protocol frame ahead of time slots assigned to users that cannot handle the safety-relevant process data.

14. The transmission system according to claim 13, further characterized in that one user is configured as a safety user and for embedding safety data into the transmission protocol frame during each data transmission cycle, and at least the additional users that can handle the safety-relevant process data are configured for reading out safety data of the safety user during a respective data transmission cycle and for using read-out safety data for generating the first set of protection data during a subsequent data transmission cycle.

15. The transmission system according to claim 13, wherein, for generating the first set of protection data, users that can handle the safety-relevant process data additionally include at least one protection identifier that identifies each slave to which the safety-relevant process data is to be assigned.

16. The transmission system according to claim 13, wherein each transmission protocol frame is protected as a whole with a third set of protection data, the master is configured to generate the third set of protection data by using all the data transmitted therein, and all slaves are configured to read the data contained in the transmission protocol frame and to generate a corresponding third set of protection data.

17. The transmission system according to claim 14, further characterized in that a time slot inside the transmission protocol frame is permanently assigned to the safety user, and the safety user is configured for generating a run date varying cyclically in each case.

18. The transmission system according to claim 14, wherein the safety user is configured for generating and embedding control data.

19. The transmission system according to claim 14, characterized in that the safety user is configured to generate a second set of protection data by using the safety data and to embed it in the time slot together with the safety data.

* * * * *